(12) United States Patent
Kiriyama et al.

(10) Patent No.: US 8,310,028 B2
(45) Date of Patent: Nov. 13, 2012

(54) SEMICONDUCTOR DEVICE WITH CRYSTAL DEFECT AND MANUFACTURING METHOD THEREOF

(75) Inventors: Tatsuya Kiriyama, Kyoto (JP); Noriaki Kawamoto, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 140 days.

(21) Appl. No.: 12/811,878

(22) PCT Filed: Jan. 9, 2009

(86) PCT No.: PCT/JP2009/050244
§ 371 (c)(1), (2), (4) Date: Jul. 7, 2010

(87) PCT Pub. No.: WO2009/088081
PCT Pub. Date: Jul. 16, 2009

(65) Prior Publication Data
US 2010/0283126 A1    Nov. 11, 2010

(30) Foreign Application Priority Data
Jan. 9, 2008  (JP) .................... 2008-002004

(51) Int. Cl.
*H01L 29/30*  (2006.01)
*H01L 21/28*  (2006.01)
*H01L 21/3205*  (2006.01)

(52) U.S. Cl. ........... 257/602; 257/E29.02; 257/E21.125; 438/602

(58) Field of Classification Search ................ 257/190, 257/289, 617, E21.125, E29.02; 438/46, 438/602
See application file for complete search history.

(56) References Cited

U.S. PATENT DOCUMENTS
7,977,210 B2 *  7/2011  Ota et al. .................... 438/459

FOREIGN PATENT DOCUMENTS

| JP | 62-190360   | 12/1987 |
| JP | 05-048117   | 2/1993  |
| JP | 2002-134760 | 5/2002  |
| JP | 2003-332562 | 11/2003 |
| JP | 2004-047605 | 2/2004  |
| JP | 2004-111759 | 4/2004  |
| JP | 2007-095975 | 4/2007  |

* cited by examiner

*Primary Examiner* — William D Coleman
(74) *Attorney, Agent, or Firm* — Fish & Richardson P.C.

(57) ABSTRACT

A semiconductor device includes a semiconductor substrate that is made of either of silicon carbide (SiC) and gallium nitride (GaN), and has a defect region containing a crystal defect; a first insulating film that coats the defect region and is arranged on the semiconductor substrate; and a conductor film that electrically connects to a principal surface of the semiconductor substrate, the principal surface being exposed to a region that is not coated with the first insulating film.

11 Claims, 18 Drawing Sheets

FIG. 4
(a)
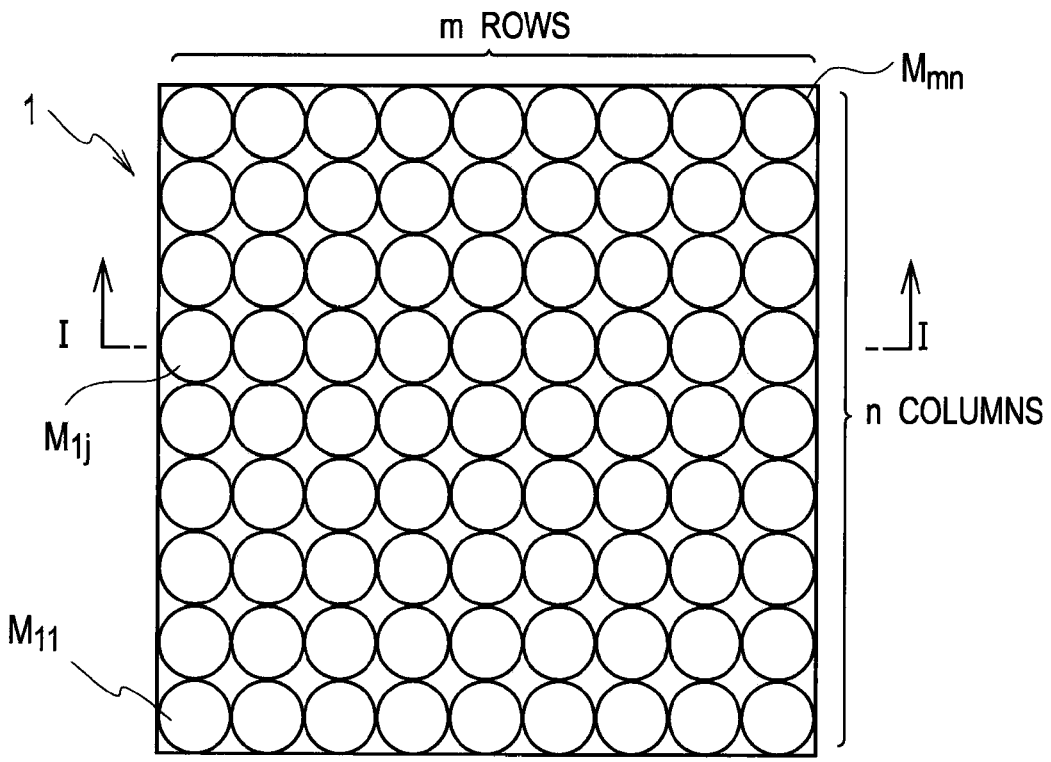
(b)
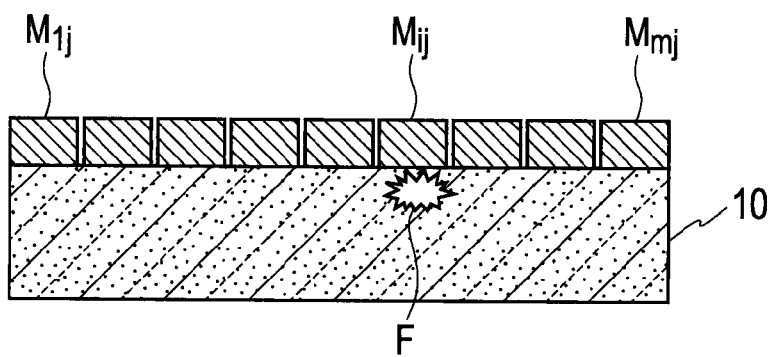

FIG. 5
(a)
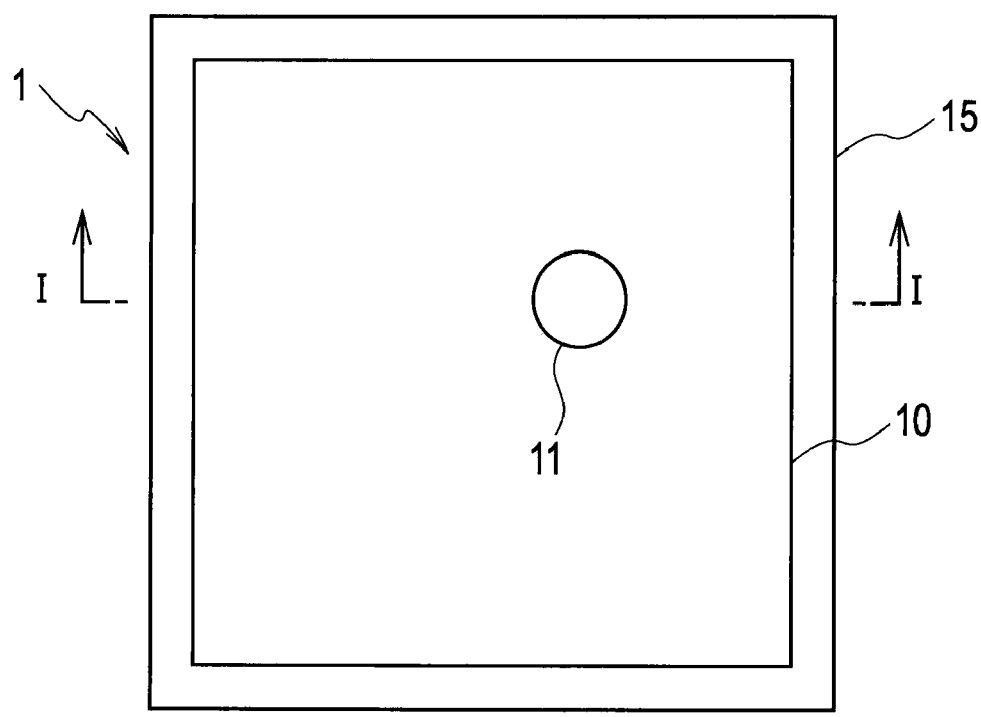
(b)
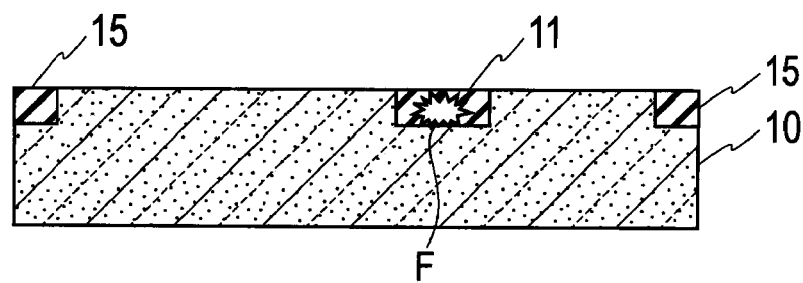

FIG. 6
(a)
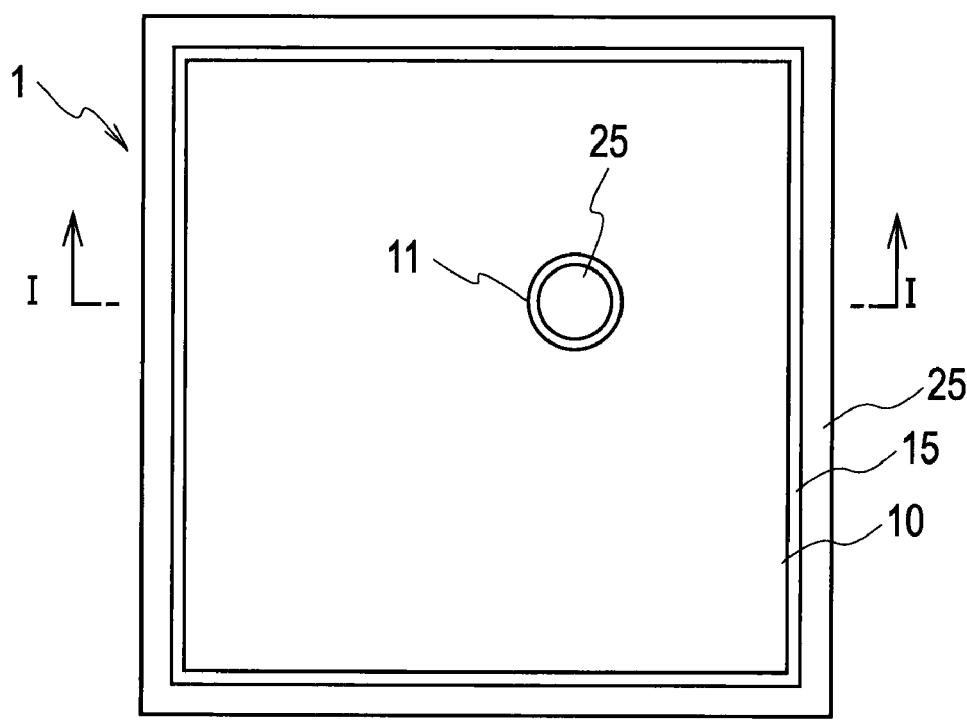
(b)
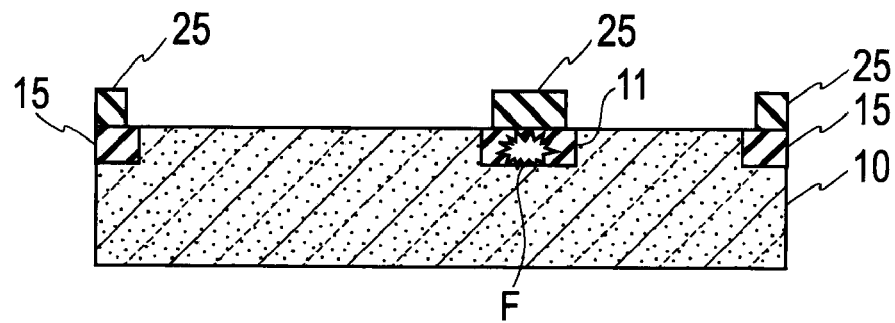

FIG. 7
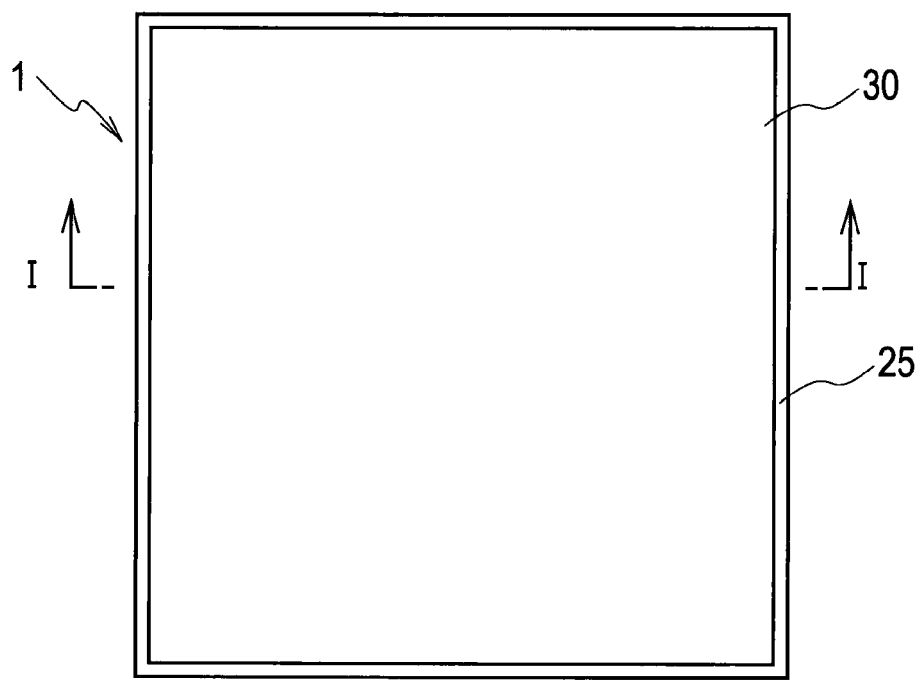
(a)
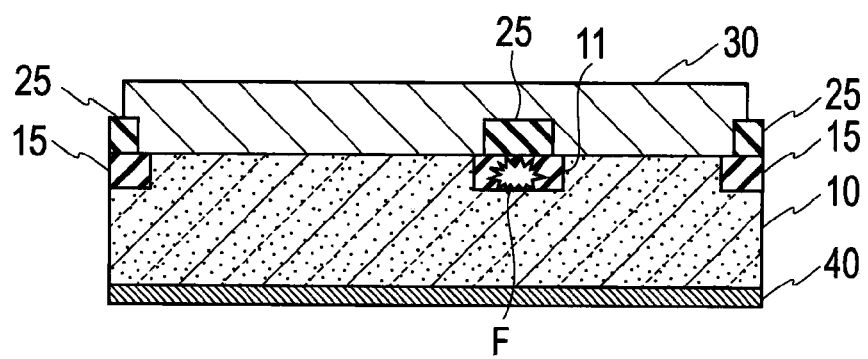
(b)

FIG. 9
(a)
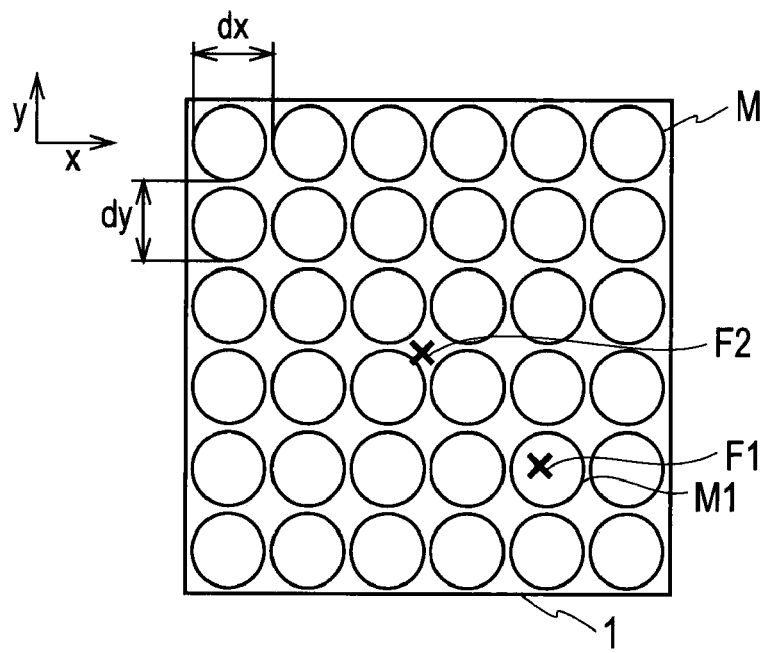
(b)
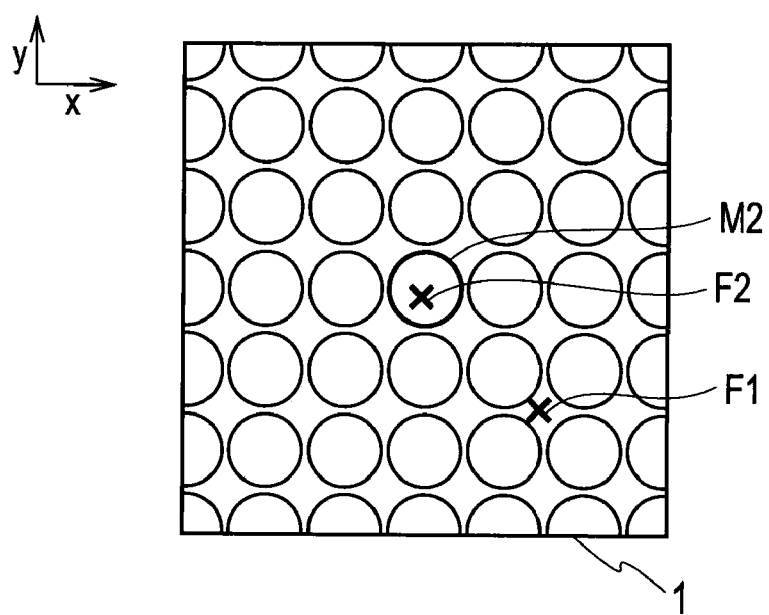

FIG. 10
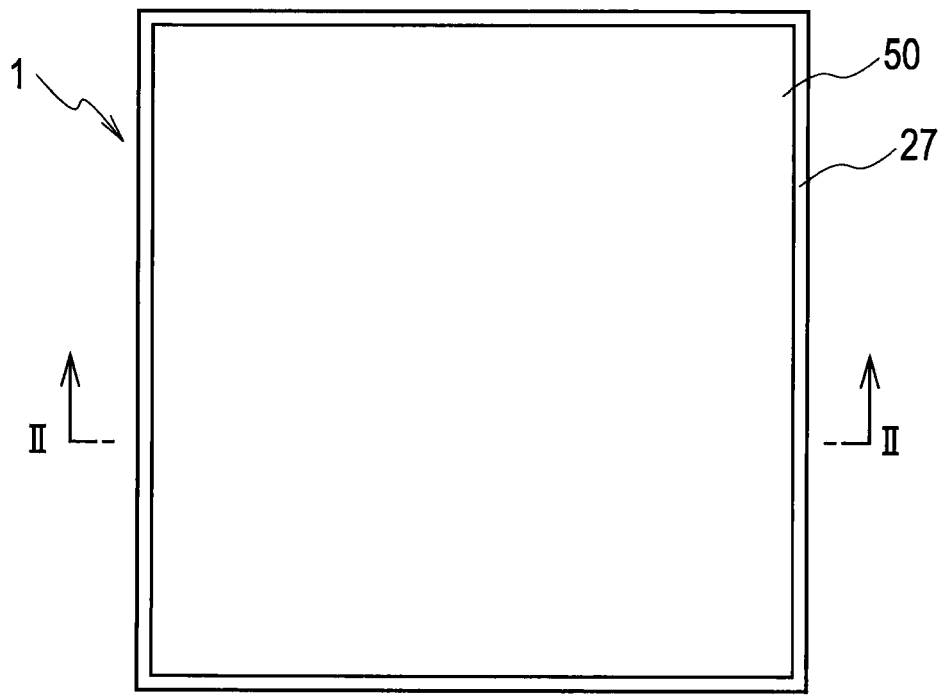
(a)
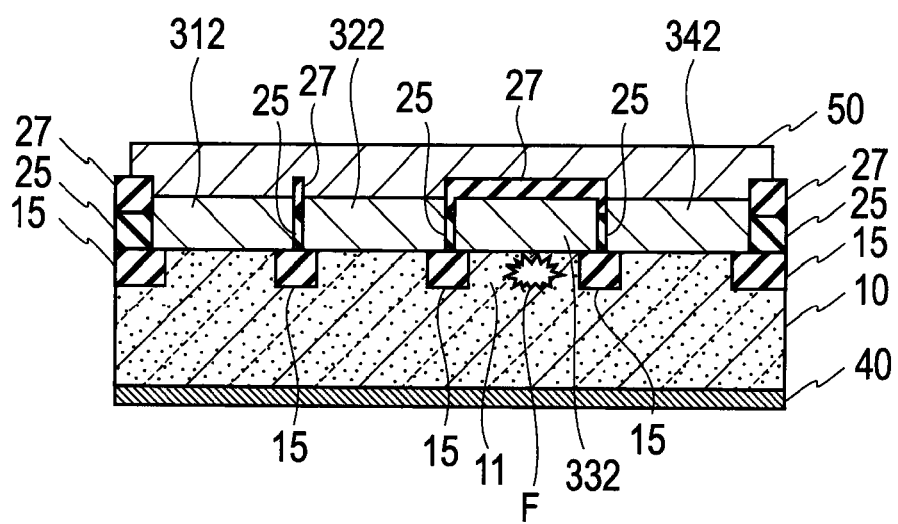
(b)

FIG. 11
(a)
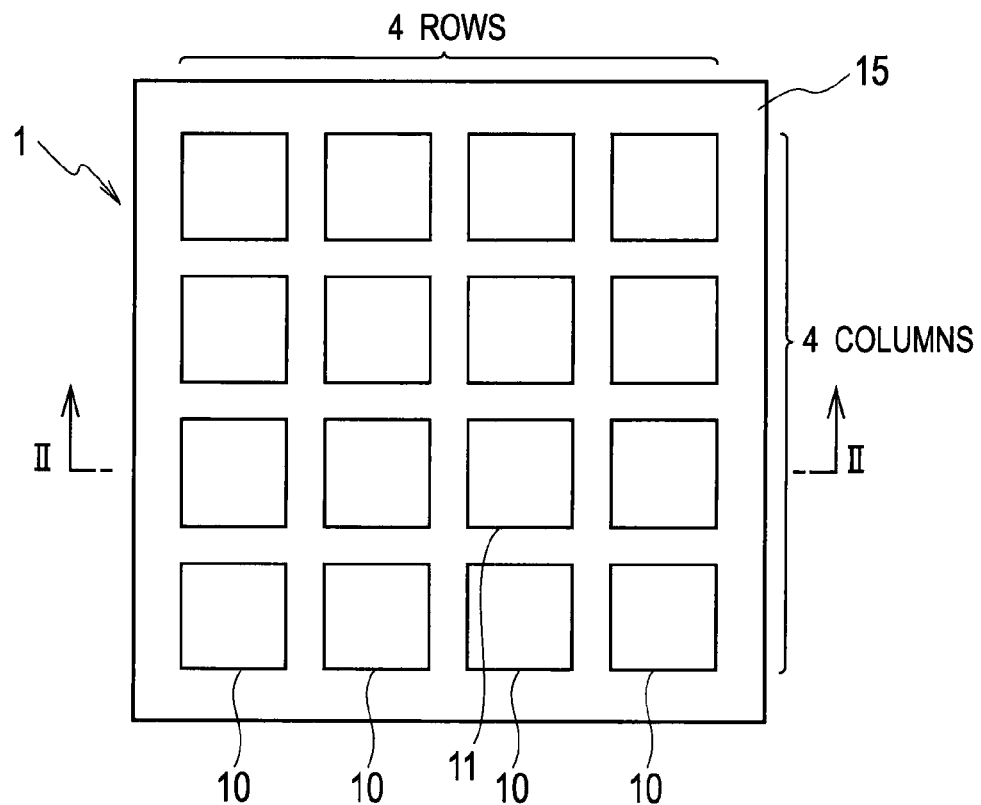
(b)
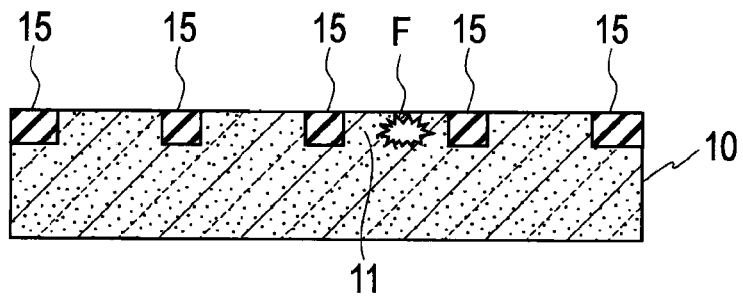

FIG. 12
(a)
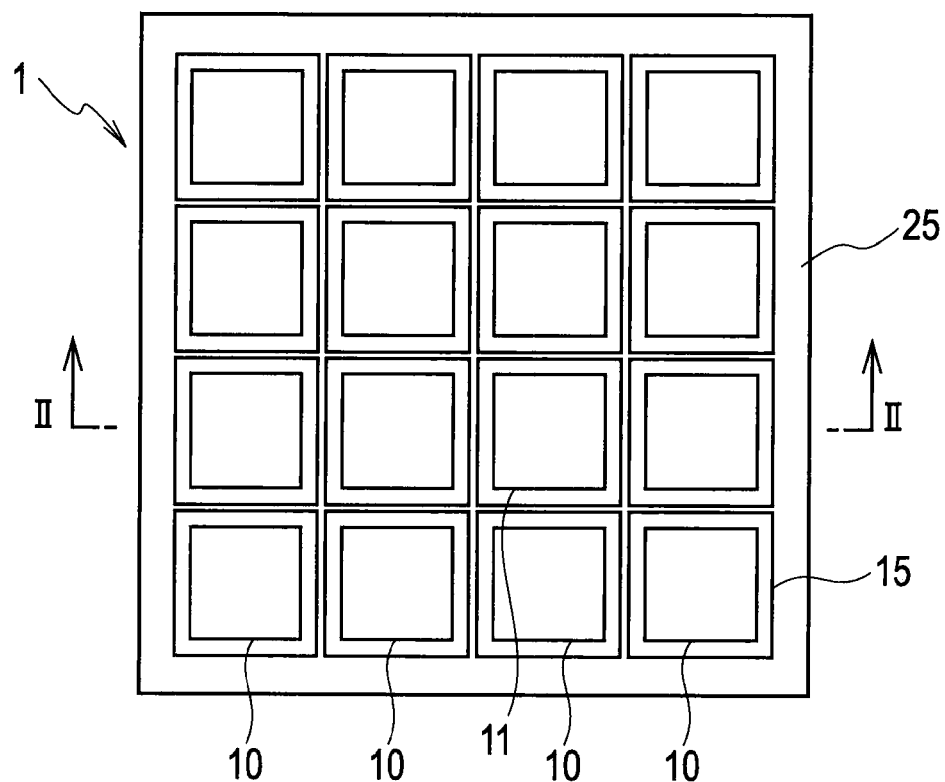
(b)
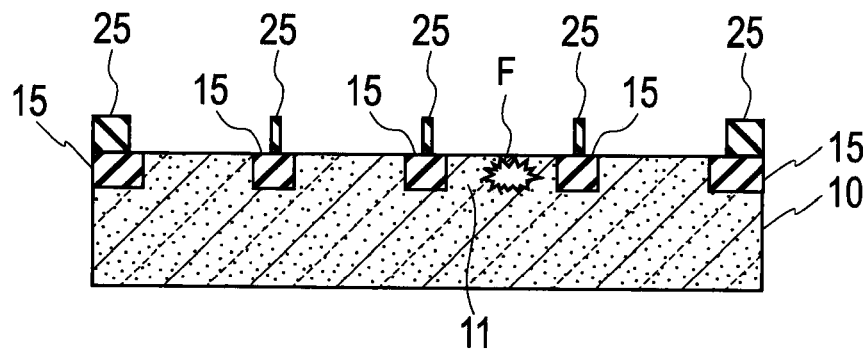

FIG. 13
(a)
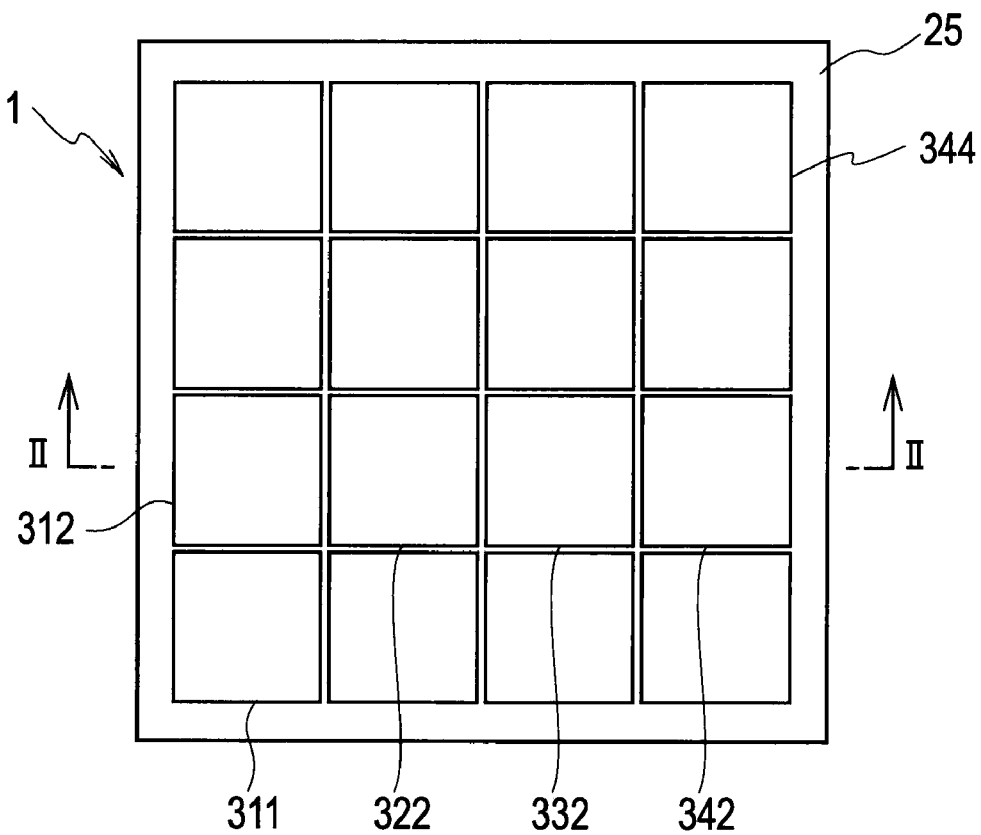
(b)
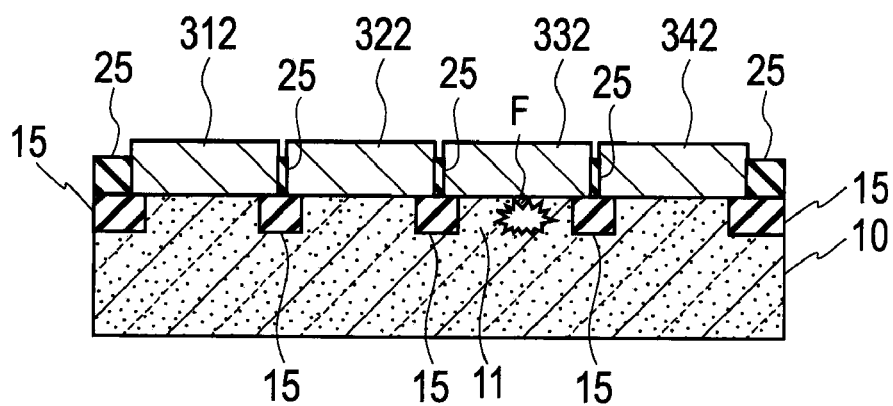

FIG. 14
(a)
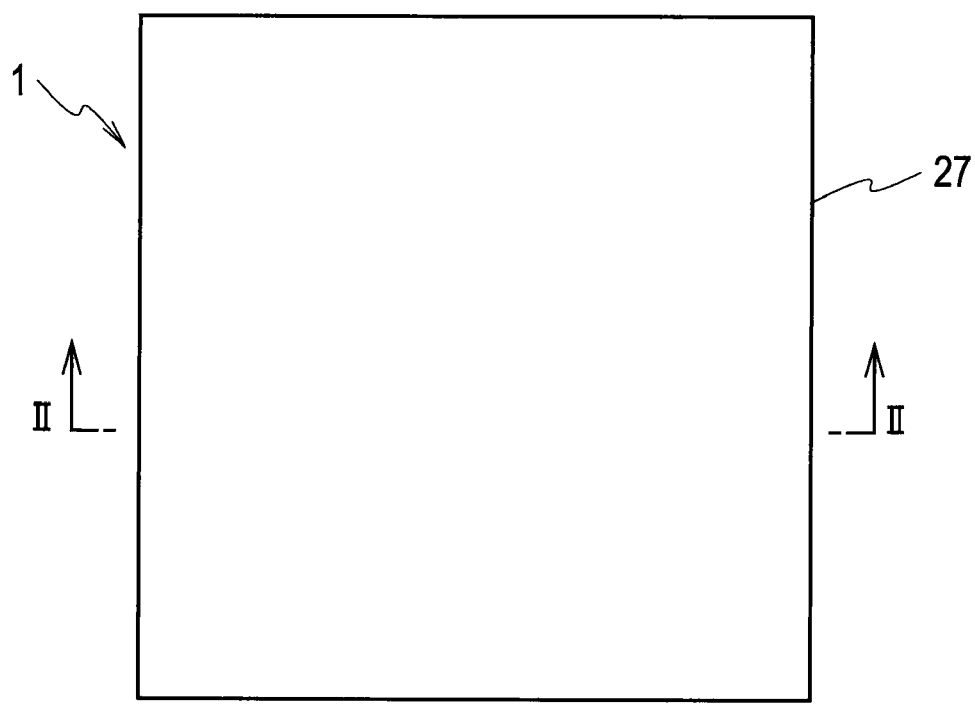
(b)
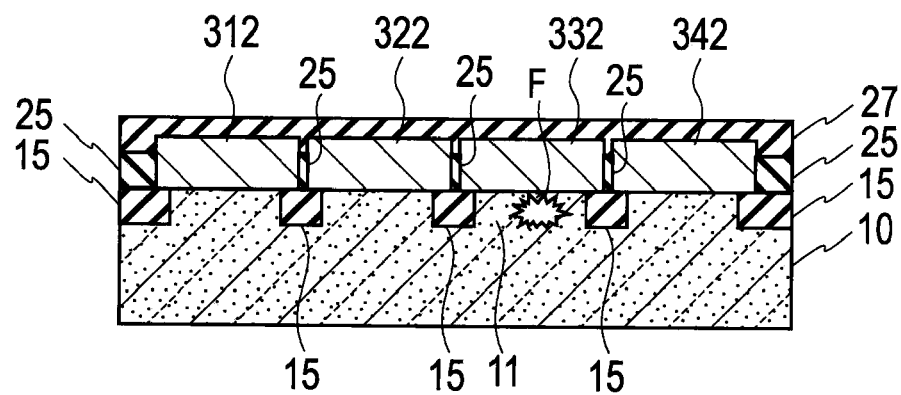

FIG. 15
(a)
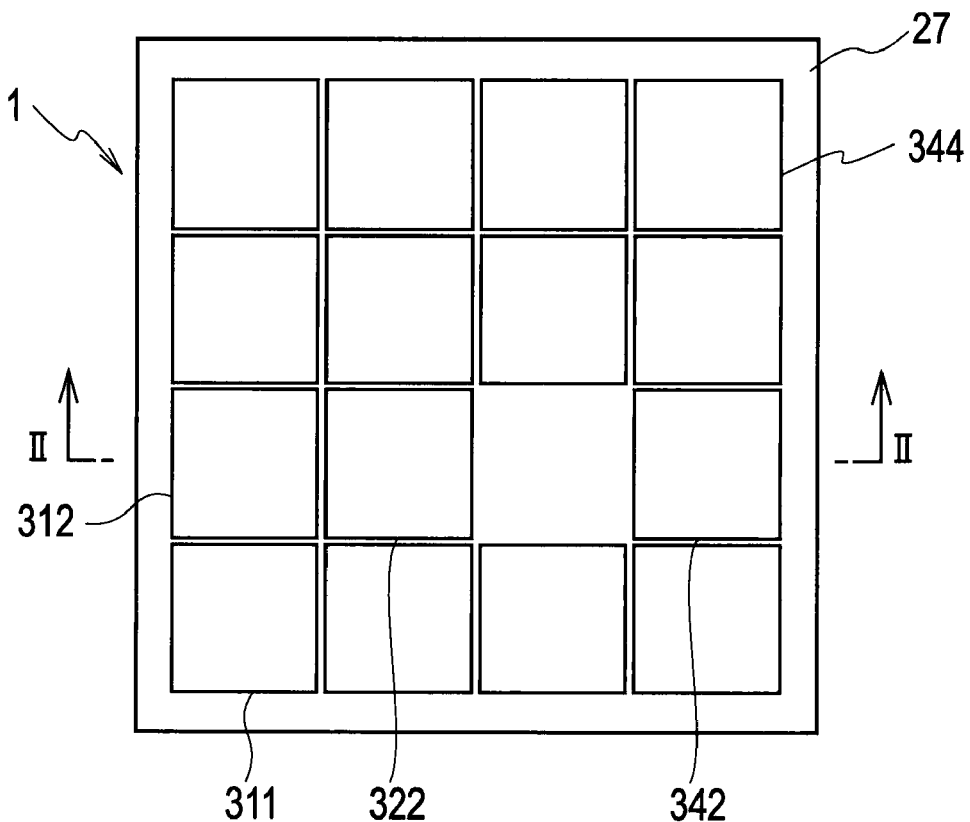
(b)
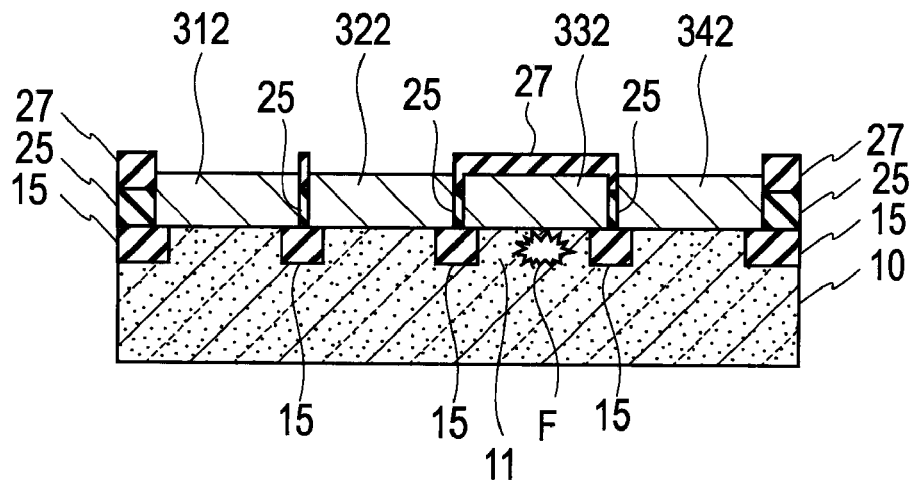

SEMICONDUCTOR DEVICE WITH CRYSTAL DEFECT AND MANUFACTURING METHOD THEREOF

TECHNICAL FIELD

The present invention relates to a semiconductor device to be used by flowing a current through a substrate thereof, and to a manufacturing method of the semiconductor device.

BACKGROUND ART

A semiconductor device to be used by flowing a current through a semiconductor substrate thereof is used in a variety of fields. For example, a semiconductor device including a Schottky barrier diode (SBD) using a Schottky junction in which a conductor film such as a metal film and a polysilicon film is arranged on the semiconductor substrate is used as a semiconductor device for an on-board inverter, or the like. The semiconductor device using the SBD has features in that power consumption is small since a turn-off time is short, and that a withstand voltage is high (for example, refer to Patent Citation 1).

[Patent Citation 1]
  Japanese Patent Laid-Open Publication No. H05-48117

DISCLOSURE OF INVENTION

[Technical Problem]

However, the semiconductor substrate for use in the SBD, and in particular, a silicon carbide (SiC) substrate, a gallium nitride (GaN) substrate, a polysilicon substrate, a diamond substrate and the like contain many crystal defects. Owing to an occurrence of a leak current caused by the crystal defects, characteristics of the semiconductor device are deteriorated, and yield of products is decreased. In particular, as an area of the semiconductor device is increased, a probability that the semiconductor substrate contains the crystal defects is increased, and accordingly, there has been a problem that yield of semiconductor devices, each having a large-area Schottky junction, or of the like, is decreased.

In consideration of the above-described problem, it is an object of the present invention to provide a semiconductor device and a manufacturing method thereof, which are capable of suppressing a yield decrease resulting from the crystal defects of the semiconductor substrate.

[Technical Solution]

In accordance with an aspect of the present invention, a semiconductor device is provided, which includes: a semiconductor substrate that is made of either of silicon carbide (SiC) and gallium nitride (GaN), and has a defect region containing a crystal defect; a first insulating film that coats the defect region and is arranged on the semiconductor substrate; and a conductor film that electrically connects to a principal surface of the semiconductor substrate, the principal surface being exposed to a region that is not coated with the first insulating film.

In accordance with another aspect of the present invention, a manufacturing method of a semiconductor device is provided, which includes: arranging a plurality of testing conductor films on a principal surface of a semiconductor substrate made of either of silicon carbide (SiC) and gallium nitride (GaN); measuring electric characteristics of the semiconductor substrate by using the respective testing conductor films; specifying a defect region in the semiconductor substrate, the defect region containing a crystal defect, by using measurement results of the electric characteristics; and forming a conductor film that electrically connects to a region in the semiconductor substrate, the region excluding the defect region, on the principal surface of the semiconductor substrate.

[Advantageous Effects]

In accordance with the present invention, the semiconductor device and the manufacturing method thereof can be provided, which are capable of suppressing the yield decrease resulting from the crystal defects of the semiconductor substrate.

BRIEF DESCRIPTION OF DRAWINGS

FIGS. 4(a) and 4(b) are process diagrams for explaining a manufacturing method of the semiconductor device according to the first embodiment of the present invention (No. 1): FIG. 4(a) is a plan view; and FIG. 4(b) is a cross-sectional view taken along a I-I direction of FIG. 4(a).

FIGS. 5(a) and 5(b) are process diagrams for explaining the manufacturing method of the semiconductor device according to the first embodiment of the present invention (No. 2): FIG. 5(a) is a plan view; and FIG. 5(b) is a cross-sectional view taken along a I-I direction of FIG. 5(a).

FIGS. 6(a) and 6(b) are process diagrams for explaining the manufacturing method of the semiconductor device according to the first embodiment of the present invention (No. 3): FIG. 6(a) is a plan view; and FIG. 6(b) is a cross-sectional view taken along a I-I direction of FIG. 6(a).

FIGS. 7(a) and 7(b) are process diagrams for explaining the manufacturing method of the semiconductor device according to the first embodiment of the present invention (No. 4); FIG. 7(a) is a plan view; and FIG. 7(b) is a cross-sectional view taken along a I-I direction of FIG. 7(a).

FIGS. 9(a) and 9(b) are schematic views for explaining a method of measuring electric characteristics of the semiconductor device according to the first embodiment of the present invention: FIG. 9(a) is a first measurement method of the electric characteristics; and FIG. 9(b) is a second measurement method of the electric characteristics.

FIGS. 10(a) and 10(b) are schematic views showing a configuration of a semiconductor device according to a second embodiment of the present invention: FIG. 10(a) is a plan view; and FIG. 10(b) is a cross-sectional view taken along a II-II direction of FIG. 10(a).

FIGS. 11(a) and 11(b) are process diagrams for explaining a manufacturing method of the semiconductor device according to the second embodiment of the present invention (No. 1): FIG. 11(a) is a plan view; and FIG. 11(b) is a cross-sectional view taken along a II-II direction of FIG. 11(a).

FIGS. 12(a) and 12(b) are process diagrams for explaining the manufacturing method of the semiconductor device according to the second embodiment of the present invention (No. 2): FIG. 12(a) is a plan view; and FIG. 12(b) is a cross-sectional view taken along a II-II direction of FIG. 12(a).

FIGS. 13(a) and 13(b) are process diagrams for explaining the manufacturing method of the semiconductor device according to the second embodiment of the present invention (No. 3): FIG. 13(a) is a plan view; and FIG. 13(b) is a cross-sectional view taken along a II-II direction of FIG. 13(a).

FIGS. 14(a) and 14(b) are process diagrams for explaining the manufacturing method of the semiconductor device according to the second embodiment of the present invention (No. 4): FIG. 14(a) is a plan view; and FIG. 14(b) is a cross-sectional view taken along a II-II direction of FIG. 14(a).

FIGS. 15(a) and 15(b) are process diagrams for explaining the manufacturing method of the semiconductor device according to the second embodiment of the present invention (No. 5): FIG. 15(a) is a plan view; and FIG. 15(b) is a cross-sectional view taken along a II-II direction of FIG. 15(a).

BEST MODE FOR CARRYING OUT THE INVENTION

Figure 1:
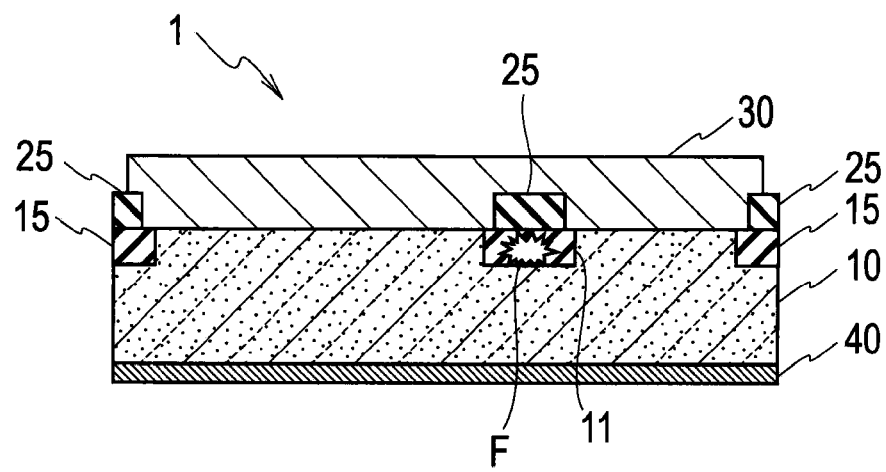
FIG. 1 is a schematic cross-sectional view showing a configuration of a semiconductor device according to a first embodiment of the present invention.

Next, a description will be made of first to third embodiments of the present invention with reference to the drawings. In the following description referring to the drawings, the same or similar reference numerals are assigned to the same or similar portions. However, the drawings are schematic, and it should be noted that a relationship between thicknesses and planar dimensions, a ratio of thicknesses of the respective layers, and the like are different from the actual ones. Hence, specific thicknesses and dimensions should be determined in consideration of the following description. Moreover, it is a matter of course that portions different in dimensional relationship and ratio are also included among the respective drawings.

Moreover, the first to third embodiments described below illustrate an apparatus and a method, which are for embodying the technical idea of this invention, and the technical idea of this invention does not specify materials, shapes, structures, arrangements and the like of constituent components to those in the following description. The technical idea of this invention can be modified in various ways within the scope of claims.

(First Embodiment)

As shown in FIG. 1, a semiconductor device 1 according to the first embodiment of the present invention includes: a semiconductor substrate 10 that has a defect region 11 containing a crystal defect F; an insulating film 25 that coats the defect region 11 and is arranged on the semiconductor substrate 10; and a conductor film 30 that electrically connects to a principal surface of the semiconductor substrate 10, which is exposed to a region that is not coated with the insulating film 25. The semiconductor device 1 further includes: a guard ring 15 that is arranged on a part of an upper portion of the semiconductor substrate 10 along an outer edge of the semiconductor device 1; and a back surface electrode 40 that is arranged on a back surface of the semiconductor substrate 10 so as to be opposite with the conductor film 30. Moreover, another insulating film 25 is arranged on the guard ring 15.

For the semiconductor substrate 10, a silicon carbide (SiC) substrate, a gallium nitride (GaN) substrate and the like are adoptable. For example, the SiC substrate is superior to a silicon (Si) substrate in terms of low on-resistance, high-temperature operation, high-speed switching, low loss and the like. The conductor film 30 is, for example, a metal film or a polysilicon film, and a material of the conductor film is selected in response to the material of the semiconductor substrate 10.

The guard ring 15 is an insulating region formed by turning a part of the semiconductor substrate 10 into an insulator by means of ion implantation and the like. For example, when ions of boron (B) and the like are implanted into the SiC substrate by an ion implantation method and the like, a crystal structure of the SiC substrate is broken, and a region thereof into which the ions are implanted becomes the insulator. In a similar way to the guard ring 15, the defect region 11 is also an insulating region formed by the ion implantation and the like. Note that a conduction type of the guard ring 15 may be differentiated from that of the semiconductor substrate 10. Specifically, in the case where the conduction type of the semiconductor substrate 10 is an n-type, the guard ring 15 is set as a p-type. Alternatively, in the case where the conduction type of the semiconductor substrate 10 is the p-type, the guard ring 15 is set as the n-type.

For the insulating films 25 formed on the defect region 11 and the guard ring 15, for example, a silicon oxide ($SiO_2$) film and the like are adoptable.

The semiconductor device 1 shown in FIG. 1 is an SBD in which a current flows through a Schottky junction formed on a contact surface between the semiconductor substrate 10 and the conductor film 30 in response to a voltage applied between the conductor film 30 and the back surface electrode 40. In the semiconductor device 1, electric field concentration onto a peripheral portion of the semiconductor device 1 is relieved by the guard ring 15 and the insulating film 25 formed on the guard ring 15, and withstand voltage characteristics of the semiconductor device 1 are enhanced.

Figure 2:
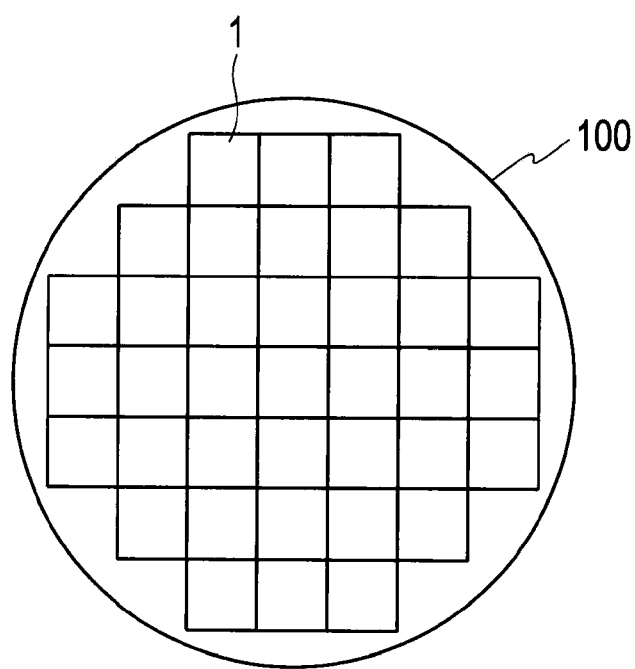
FIG. 2 is a schematic view of a wafer on which a plurality of the semiconductor devices according to the first embodiment of the present invention are arranged.

FIG. 2 shows an example of forming a plurality of the semiconductor devices 1 on a wafer 100. Each of the semiconductor devices 1 has a rectangular shape in which a length of each side approximately ranges from 5 mm to 1 cm. The wafer 100 is, for example, a SiC wafer and a GaN wafer, and usually, these wafers contain many crystal defects. Usually, a defect density is approximately 10 pieces/$cm^2$ or less.

Figure 3:
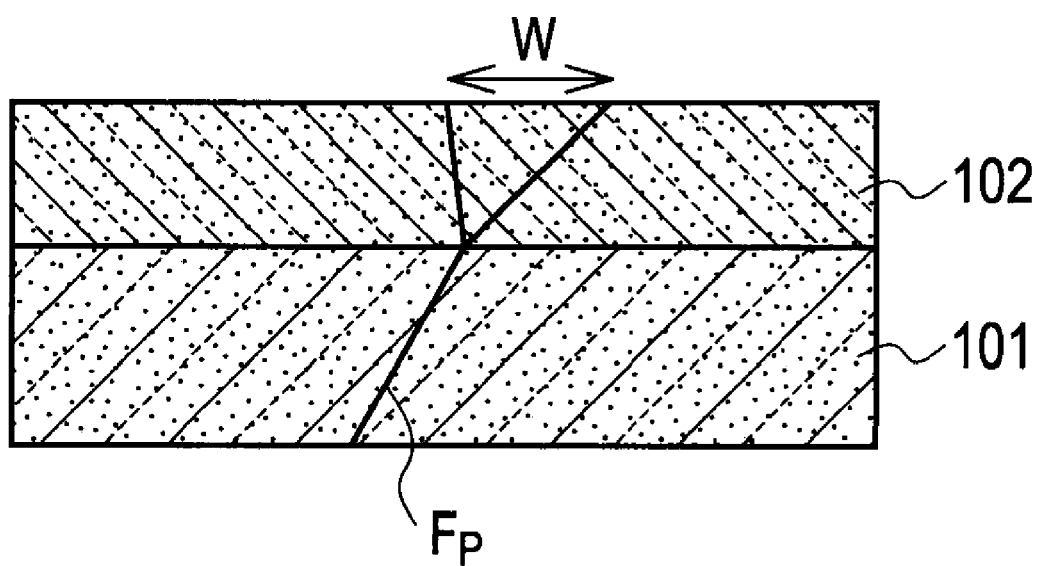
FIG. 3 is a schematic view showing an example of a crystal defect.

Each of the crystal defects is, for example, a micropipe $F_P$ as shown in FIG. 3. The micropipe $F_P$ as a hollow through defect that is generated in a substrate 101 and has a diameter of approximately 1 μm is taken over to an epitaxial film 102 at the time of growing the epitaxial film 102 concerned, and expands to a width (W) approximately ranging from 100 to 500 μm on a surface of the epitaxial film 102. Although being typically a defect that penetrates the substrate, the micropipe largely decreases characteristics of the semiconductor device even if the micropipe does not penetrate the substrate. As another example of the crystal defects, there are a downfall, a carrot, a triangular defect, a defective bit and the like, which result from particles generated at the time of growing the epitaxial film.

When the crystal defects are contained in the semiconductor substrate 10 as a current path between the conductor film 30 and the back surface electrode 40, the semiconductor substrate 1 becomes a defective piece such that the conductor film 30 and the back surface electrode 40 cause a short circuit owing to a Schottky barrier failure resulting from the crystal defects. However, as will be described later, in the semiconductor device 1, the crystal defect F in the semiconductor substrate 10 is detected before the conductor film 30 is formed, and the conductor film 30 is formed so as to be electrically insulated from the defect region 11 containing the detected crystal defect F.

Therefore, the semiconductor device 1 shown in FIG. 1 is an SBD in which only a region of the semiconductor substrate 10, the region eliminating the presence of the crystal defect F, is used as an active region through which the current flows, and the crystal defect F does not affect the electric characteristics of the semiconductor device 1. In other words, in accordance with the semiconductor device shown in FIG. 1, there is provided a semiconductor device in which a yield decrease resulting from the crystal defect of the semiconductor substrate 10 is suppressed.

A description will be made of a manufacturing method of the semiconductor device 1 according to the first embodiment of the present invention with reference to FIGS. 4(a) and 4(b) to FIGS. 7(a) and 7(b). Note that the manufacturing method of the semiconductor device 1, which will be described below, is merely an example, and it is a matter of course that the manufacturing method according to the first embodiment is realizable by other various manufacturing methods including modification examples of the manufacturing method according to the first embodiment. FIGS. 4(a), 5(a), 6(a) and 7(a) are plan views of the semiconductor substrate 10 viewed in a direction of the principal surface thereof, and FIGS. 4(b), 5(b), 6(b) and 7(b) are cross-sectional views taken along a I-I direction of FIGS. 4(a), 5(a), 6(a) and 7(a).

(A) First, as shown in FIG. 4(a) and FIG. 4(b), on the principal surface of the semiconductor substrate 10, testing conductor films $M_{11}$ to $M_{mn}$ are arranged by a sputtering method and the like so as to be spaced apart from one another in a matrix form with m rows and n columns. The testing conductor films $M_{11}$ to $M_{mn}$ are brought into contact with the principal surface of the semiconductor substrate 10, and each thereof composes the SBD having the Schottky junction. The SBDs composed of the testing conductor films $M_{11}$ to $M_{mn}$ are hereinafter referred to as "Schottky cells". For the testing conductor films $M_{11}$ to $M_{mn}$, a film of metal such as molybdenum (Mo) and a polysilicon film are adoptable.

(B) Next, electric characteristics of the respective Schottky cells are measured by using the testing conductor films $M_{11}$ to $M_{mn}$. Specifically, for example, voltages are applied between the respective testing conductor films $M_{11}$ to $M_{mn}$ and the semiconductor substrate 10 by a prober and the like, and measurement of forward current-voltage characteristics of the respective Schottky cells, and the like are performed. The electric characteristics of the respective Schottky cells are recorded together with positional information of the testing conductor films $M_{11}$ to $M_{mn}$.

(C) Quality determination for the respective Schottky cells is performed by using measurement results of the electric characteristics of the respective Schottky cells. Specifically, a Schottky cell in which the electric characteristics do not satisfy a predetermined specification value that is preset is determined to be a defective cell. Then, a region in which the Schottky cell determined to be the defective cell is formed is specified to be a defect region 11 containing the crystal defect F. Positional information (hereinafter, referred to as "defect position information") of the defect region 11 in the semiconductor substrate 10 is recorded as a part of process information. Here, the following description will be made for the case where the crystal defect F is present in a region in which a testing conductor film $M_{ij}$ is arranged, and where a Schottky cell containing the testing conductor film $M_{ij}$ is determined to be the defective cell. In other words, a position coordinate on the semiconductor substrate 10, in which the testing conductor film $M_{ij}$ is arranged, is recorded as the defect position information.

(D) After all of the testing conductor films $M_{11}$ to $M_{mn}$ are removed, the guard ring 15 is formed along the outer edge portion of the semiconductor device 1. At the same time, the defect region 11 is turned into an insulating region. Specifically, a positive-type photoresist film is applied on the entire principal surface of the semiconductor substrate 10, and thereafter, the photoresist film on the region in which the guard ring 15 is formed is exposed by stepper exposure and the like. Moreover, the wafer is moved based on the defect position information, whereby the photoresist film on the defect region 11, in which the testing conductor film $M_{ij}$ is arranged, is exposed in a spot shape. The photoresist film on the exposed region is removed, and thereafter, impurity ions (dopant) of boron (B) and the like are doped into the surface of the semiconductor substrate 10. As a result, as shown in FIG. 5(a) and FIG. 5(b), the ion implantation is selectively performed for the outer edge portion and defect region 11 of the semiconductor device 1. Crystal structures of the regions into which the ions are implanted are broken, and the guard ring 15 and the defect region 11, which are the insulating regions, are formed.

(E) Thereafter, as shown in FIG. 6(a) and FIG. 6(b), the insulating films 25 are formed on the guard ring 15 and the defect region 11. Specifically, the silicon oxide ($SiO_2$) film that becomes the insulating film 25 is deposited, for example, on the entire principal surface of the semiconductor substrate 10. Then, the $SiO_2$ film is selectively removed by etching by using the photoresist film as a mask, which is patterned by using a photolithography technique and the like, whereby a structure shown in FIG. 6(a) and FIG. 6(b) is formed.

(F) As shown in FIG. 7(a) and FIG. 7(b), the conductor film 30 is formed on the principal surface of the semiconductor substrate 10 and on the insulating films 25, and the back surface electrode 40 is formed on the back surface of the semiconductor substrate 10. For the conductor film 30, Mo, nickel (Ni), titanium (Ti) and the like are adoptable. In such a manner as described above, the semiconductor device 1 according to the first embodiment is formed.

Figure 8:
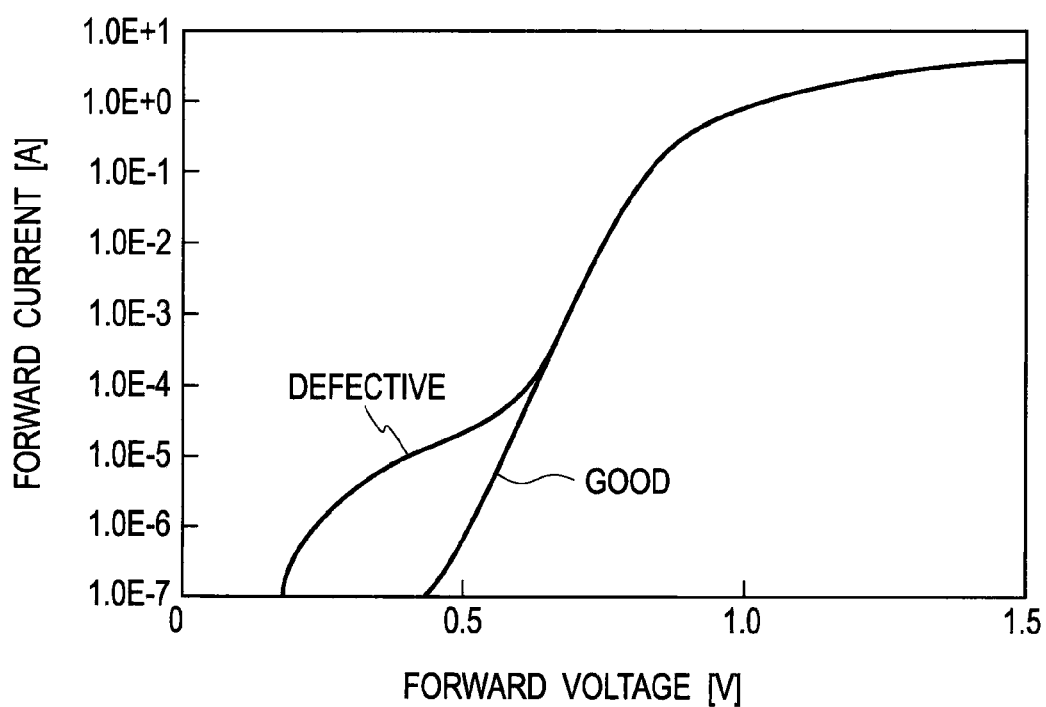
FIG. 8 is a graph for explaining a quality determination method of the semiconductor device according to the first embodiment of the present invention.

FIG. 8 shows an example of performing the quality determination for the respective Schottky cells by using the measurement results of the forward current-voltage characteristics thereof. For example, the specification value is set to a magnitude of a forward voltage when a forward current is 100 nA, and a Schottky cell in which the forward voltage is smaller than the specification value is determined to be the defective cell.

In the above-described example of the manufacturing method, the case has been illustrated, where a shape of the testing conductor films $M_{11}$ to $M_{mn}$ is circular. This is because electric field concentration onto peripheral portions of the testing conductor films $M_{11}$ to $M_{mn}$ can be relieved by forming the testing conductor films $M_{11}$ to $M_{mn}$ into a circular shape. However, the shape of the testing conductor films $M_{11}$ to $M_{mn}$ is not limited to the circular shape, and naturally, may be a rectangular shape for example.

Note that it is necessary that the testing conductor films $M_{11}$ to $M_{mn}$ be arranged so as to be spaced apart from one another. Therefore, as shown in FIG. 9(a), a crystal defect F1 is detected by measuring electric characteristics of a Schottky cell on which a testing conductor film M1 is arranged, whereas a crystal defect F2 cannot be detected since the testing conductor film is not formed thereon.

In order to reduce the number of undetected crystal defects, it is effective to measure the electric characteristics of the respective Schottky cells while changing the positions where the testing conductor films M are arranged. For example, it is assumed that, as shown in FIG. 9(a), the testing conductor films M are arranged in the matrix form on the semiconductor substrate 10 while being spaced apart from one another by a distance dx in an x-direction and by a distance dy in a y-direction. The electric characteristics of the Schottky cells are measured in this state, whereby the crystal defect F1 is detected. After the electric characteristics of the Schottky cells are measured, all of the testing conductor films M are exfoliated.

Thereafter, as shown in FIG. 9(b), the testing conducting films M are newly arranged in the matrix form while being shifted from the first time by a distance dx/2 in the x-direction and by a distance dy/2 in the y-direction. As a result, as shown in FIG. 9(b), a testing conductor film M2 is arranged on the crystal defect F2. The electric characteristics of the Schottky cells are measured in this state, whereby the crystal defect F2 is detected.

As described above, the measurement of the electric characteristics of the Schottky cells is implemented plural times while changing the positions where the testing conductor films M are arranged, whereby a detection ratio of the crystal defects can be enhanced. The measurement of the electric characteristics is performed twice, whereby the crystal defects in the semiconductor substrate 10 can be detected by nearly 100%; however, it is preferable to perform the measurement of the electric characteristics three times, which is performed while changing the positions where the testing conductor films M are arranged. Note that, in the case where the SiC substrate is adopted for the semiconductor substrate 10, and where the Mo film is adopted for the testing conductor film M, then the formation and exfoliation of the testing conductor films M are performed at a temperature at which SiC and Mo react with each other on an interface between the semiconductor substrate 10 and the testing conductor films M or lower, whereby a normal SiC surface appears by acid cleaning and the like. Therefore, it is possible to form the Schottky cells any times.

The number of testing conductor films $M_{11}$ to $M_{mn}$ arranged on the principal surface of the semiconductor substrate 10 is set based on a size of the crystal defects F generated in the semiconductor substrate 10, on a measurement time of the electric characteristics, which is allowed for the quality determination for the respective Schottky cells, and on the like. If the number of testing conductor films $M_{11}$ to $M_{mn}$ is increased, then a sensitivity to detect the crystal defects F can be increased, and in addition, an area of the defect region 11 is reduced, whereby reduction of an area of the active region can be suppressed. However, if the number of testing conductor films $M_{11}$ to $M_{mn}$ is increased, then the measurement time of the electric characteristics of all the Schottky cells is extended. Usually, the size of the crystal defects is approximately 100 μm, and accordingly, a diameter of the testing conductor films $M_{11}$ to $M_{mn}$ can be set at approximately 500 μm.

If the length of each side of the semiconductor device 1 is set at approximately 1 cm, and the diameter of the testing conductor films $M_{11}$ to $M_{mn}$ is set at approximately 500 μm, then the testing conductor films $M_{11}$ to $M_{mn}$ which form a matrix of approximately 20 rows and approximately 20 columns, are arranged on the principal surface of the semiconductor substrate 10, and approximately 400 pieces of the Schottky cells are formed thereon.

In accordance with the above-described manufacturing method of the semiconductor device 1 according to the first embodiment, the micro defects F can be detected, which cannot be detected by a visual inspection using a microscope and the like. Then, the defect region 11 containing the crystal defect F is turned into the insulating region that is electrically inactive, and in addition, the insulating film 25 is formed on the defect region 11, whereby the defect region 11 can be turned into a non-active region through which the current does not flow at the time when the semiconductor device 1 is operated.

As described above, the semiconductor device 1 shown in FIG. 1 does not contain the defect region 11 in the current path thereof. Accordingly, even in the case where the semiconductor substrate 10 contains the defect region 11, the semiconductor device 1 has good electric characteristics, and does not become the defective piece. Specifically, in accordance with the semiconductor device 1 shown in FIG. 1 and with the manufacturing method of the semiconductor device 1, the yield decrease resulting from the crystal defect F of the semiconductor substrate 10 can be suppressed. In particular, a large effect is brought in the case of a semiconductor device with a large area, for example, an SBD in which a length of each side is 5 mm or 1 cm, and the like.

Moreover, a defect analyzer may be used in order to specify the position of the crystal defect. Specifically, by the defect analyzer, a laser beam is irradiated onto the wafer 100, and reflected light of the laser beam is measured. In the case where the defect is contained in the wafer 100, a disturbance occurs in the reflected light, and accordingly, the position of the crystal defect is specified by detecting the disturbance of the reflected light. A position coordinate of the crystal defect specified by the defect analyzer is recorded as the defect position information. Thereafter, in a similar way to the method described with reference FIGS. 5(a) and 5(b) to FIGS. 7(a) and 7(b), the defect region 11 containing the crystal defect F is turned into the insulating region that is electrically inactive, and the insulating film 25 is formed on the defect region 11, whereby the semiconductor device 1 is manufactured.

(Second Embodiment)

As shown in FIG. 10(a) and FIG. 10(b), a semiconductor device 1 according to a second embodiment of the present invention includes a first conductor film 332 as a conductor film (hereinafter, referred to as "isolated-pattern conductor film"), which is arranged on the defect region 11 containing the crystal defect F in the semiconductor substrate 10, and is electrically insulated from a second conductor layer 50 by the insulating film 25 and an insulating film 27. Moreover, an upper surface of the semiconductor substrate 10 is divided into a plurality of regions by the guard ring 15, and first conductor films 312, 322, 332 and 342 are individually arranged on the principal surface of the semiconductor substrate 10, which is divided by the guard ring 15. The first conductor films 312, 322, 332 and 342 are metal films or polysilicon films.

As shown in FIG. 10(b), the first conductor films 312, 322, 332 and 342 are separated from one another by the insulating film 25 and the insulating film 27. An upper surface of the first conductor film 332 as the isolated-pattern conductor film is covered with the insulating film 27. Then, the second conductor layer 50 is arranged on the first conductor films 312, 322 and 342, and the second conductor layer 50 is arranged on the insulating film 27 that covers the first conductor film 332 (isolated-pattern conductor film).

The semiconductor device 1 shown FIG. 10(b) is an SBD in which currents flow through Schottky junctions formed on contact surfaces between the semiconductor substrate 10 and the first conductor films 312, 322 and 342 in response to a voltage applied between the second conductor layer 50 and the back surface electrode 40. However, the first conductor film 332 arranged on the defect region 11 containing the crystal defect F is the isolated-pattern conductor film electrically insulated from the second conductor layer 50. Therefore, in the semiconductor device 1 shown in FIG. 10(a) and FIG. 10(b), the currents flow through only the regions of the semiconductor substrate 10, where the crystal defect F is not present, and the crystal defect F does not affect the electric characteristics of the semiconductor device 1. In other words, in accordance with the semiconductor device 1 shown in FIG. 10(a) and FIG. 10(b), there is provided the semiconductor device in which the yield decrease resulting from the crystal defect F of the semiconductor substrate 10 can be suppressed.

A description will be made of a manufacturing method of the semiconductor device 1 according to the second embodiment of the present invention by using FIGS. 11(a) and 11(b) to FIGS. 15(a) and 15(b). Note that the manufacturing method of the semiconductor device 1, which will be described below, is merely an example, and it is a matter of course that the manufacturing method according to the second embodiment is realizable by other various manufacturing methods including modification examples of the manufacturing method according to the second embodiment. FIGS. 11(a), 12(a), 13(a) 14(a) and 15(a) are plan views of the semiconductor substrate 10 viewed in a direction of the principal surface thereof, and FIGS. 11(b), 12(b), 13(b), 14(b) and 15(b) are cross-sectional views taken along a II-II direction of FIGS. 11(a), 12(a), 13(a), 14(a) and 15(a).

(A) The principal surface of the semiconductor substrate 10 is divided into the plurality of regions separated from one another by the guard ring 15. For example, the ions of boron (B) and the like are selectively implanted into the semiconductor substrate 10 such as the SiC substrate by using the photoresist film as a mask, which is patterned by using the photolithography technique and the like, whereby the guard ring 15 is formed. FIG. 11(a) and FIG. 11(b) show an example where the guard ring 15 that has a lattice shape is formed on the principal surface of the semiconductor substrate 10. As shown in FIG. 11(a) and FIG. 11(b), the principal surface of the semiconductor substrate 10 is divided into rectangular regions forming a matrix of four rows and four columns, in which peripheries are surrounded by the guard ring 15. Note that, though the semiconductor substrate 10 contains the crystal defect F as shown in FIG. 11(a) and FIG. 11(b), the crystal defect F is not detected at this point of time, and the position of the defect region 11 is also unknown.

(B) Next, as shown in FIG. 12(a) and FIG. 12(b), the insulating film 25 is formed on the guard ring 15. Specifically, the $SiO_2$ film that becomes the insulating film 25 is deposited, for example, on the entire principal surface of the semiconductor substrate 10. Then, the $SiO_2$ film is selectively removed by etching by using the photoresist film as a mask, which is patterned by using the photolithography technique and the like, whereby a structure shown in FIG. 12(a) and FIG. 12(b) is formed.

(C) As shown in FIG. 13(a) and FIG. 13(b), the first conductor films 311 to 344 are formed on the respective regions on the principal surface of the semiconductor substrate 10, which are surrounded by the insulating film 25. For the first conductor films 311 to 344, Mo, Ni, Ti and the like are adoptable. Each of the first conductor films 311 to 344 forms the Schottky junction by being brought into contact with the principal surface of the semiconductor substrate 10, and composes the SBD in which the guard ring 15 is arranged on a peripheral portion. The SBD composed of each of the first conductor films 311 to 344 is hereinafter referred to as an "SBD cell".

(D) Next, electric characteristics of the respective SBD cells are measured by using the first conductor films 311 to 344. Specifically, for example, voltages are applied between the respective first conductor films 311 to 344 and the semiconductor substrate 10 by the prober and the like, and measurement of forward current-voltage characteristics and reverse current-voltage characteristics of the respective SBD cells, and the like are performed. In other words, the first conductor films 311 to 344 also serve as the testing conductor films described in the first embodiment. The electric characteristics of the respective SBD cells are recorded together with positional information of the first conductor films 311 to 344.

(E) Quality determination for the respective SBD cells is performed by using measurement results of the electric characteristics of the respective SBD cells. Specifically, an SBD cell in which the electric characteristics do not satisfy a predetermined specification value that is preset is determined to be a defective cell. Then, a region in which the SBD cell determined to be the defective cell is formed is specified to be a defect region 11 containing the crystal defect F. Defect position information of the semiconductor substrate 10 is recorded as a part of the process information. Here, the following description will be made for the case where the crystal defect F is present in a region in which the first conductor film 332 is arranged, and where an SBD cell composing the first conductor film 332 is determined to be the defective cell. In other words, a position coordinate on the semiconductor substrate 10, in which the first conductor film 332 is arranged, is recorded as the defect position information.

(F) Among the first conductor films 311 to 344, only on the first conductor film 332 arranged on the defect region 11, the insulating film 27 is arranged. Specifically, as shown in FIG. 14(a) and FIG. 14(b), the insulating film 27 composed of the $SiO_2$ and the like is formed entirely on the first conductor films 311 to 344 and the insulating film 25. A negative-type photoresist film is applied on the insulating film 27, and the photoresist film on the insulating film 25 is exposed. Moreover, the wafer is moved based on the defect position information, whereby the photoresist film on the defect region 11 on which the first conductor film 332 is arranged is exposed. After the photoresist film on the unexposed regions is removed, the insulating film 27 is removed by etching as shown in FIG. 15(a) and FIG. 15(b) by using the remaining photoresist film as a mask. Therefore, the insulating film 27 is arranged only on the first conductor film 332 among the first conductor films 311 to 344, and the first conductor film 332 becomes the isolated-pattern conductor film.

(G) Thereafter, the second conductor layer 50 and the back surface electrode 40 are formed, whereby the semiconductor device 1 shown in FIG. 10(a) and FIG. 10(b) is completed. For the second conductor layer 50, a film of metal such as aluminum (Al) and copper (Cu) is adoptable.

In the semiconductor device 1 according to the second embodiment, the first conductor films 311 to 344 other than the first conductor film 332 connect to the second conductor layer 50. Therefore, the semiconductor device 1 shown in FIG. 10(a) and FIG. 10(b) function as a large-area SBD in which the SBD cells other than such a defective SBD cell containing the defect region 11 are arranged in parallel.

Figure 16:
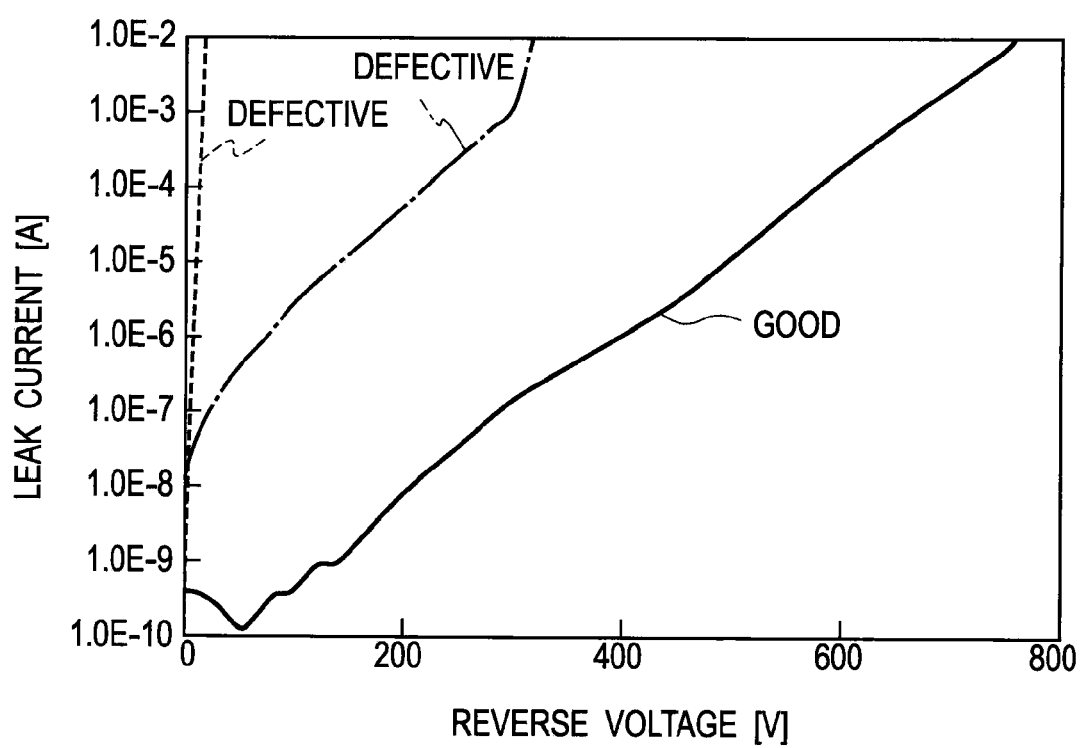
FIG. 16 is a graph for explaining a quality determination method of the semiconductor device according to the second embodiment of the present invention.

In the semiconductor device 1 shown in FIG. 10(a) and FIG. 10(b), the electric characteristics of the plurality of SBD cells, each having an active region surrounded by the guard ring 15, are measured, and the crystal defect F is detected. The guard ring 15 is formed for the respective SBD cells, and accordingly, reverse voltages can be applied to the SBD cells. Therefore, the quality determination for the respective SBD cells can be executed by using, as a reference, a reverse voltage value that is a product specification of the semiconductor device 1. FIG. 16 shows an example of performing the quality determination for the SBD cells based on leak current values in the case of applying the reverse voltages thereto. For example, a specification value is set at a magnitude of the leak current when the reverse voltage is 100V, and an SBD cell in which the leak current is larger than the specification value concerned is determined to be defective.

As described above, in accordance with the manufacturing method of the semiconductor device 1 according to the second embodiment, the quality determination for the respective SBD cells can be performed by using the measurement results of both of the forward current-voltage measurement and the reverse current-voltage measurement. Therefore, the crystal defect F that causes the defect of the semiconductor device 1 can be detected with high accuracy.

In accordance with the manufacturing method of the semiconductor device 1 according to the second embodiment, the plurality of SBD cells, each including the guard ring 15, are formed, and the crystal defect F is detected. Then, only the first conductor film 332 arranged on the defect region 11 containing the crystal defect F is turned into the isolated-pattern conductive film that is not electrically connected to the second conductor layer 50, whereby the defect region 11 can be turned into the non-active region through which the current does not flow.

The semiconductor device 1 shown in FIG. 10(a) and FIG. 10(b) does not contain the defect region 11 in the current path thereof. Accordingly, even in the case where the semiconductor substrate 10 contains the defect region 11, the semiconductor device 1 has good electric characteristics, and does not become the defective piece. Specifically, in accordance with the semiconductor device 1 according to the second embodiment and with the manufacturing method of the semiconductor device 1 concerned, the yield decrease resulting from the crystal defect F of the semiconductor substrate 10 can be suppressed. Others are substantially similar to those of the first embodiment, and a duplicate description will be omitted.

(Third Embodiment)

Figure 17:
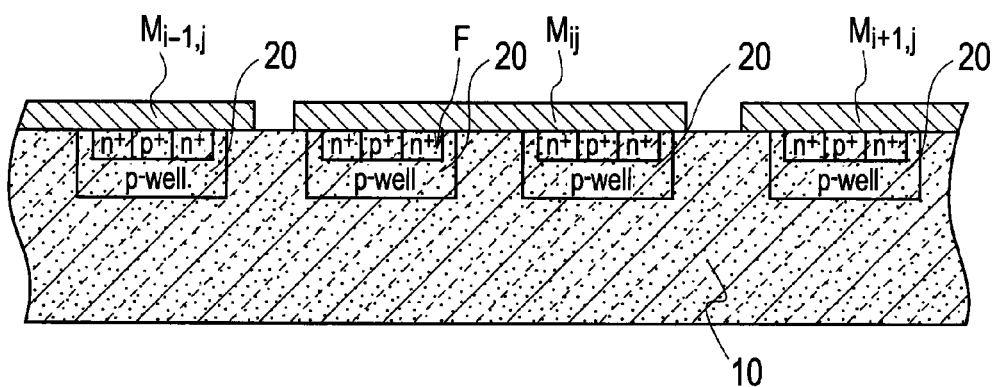
FIG. 17 is a process cross-sectional view for explaining a manufacturing method of a semiconductor device according to a third embodiment of the present invention (No. 1).
Figure 18:
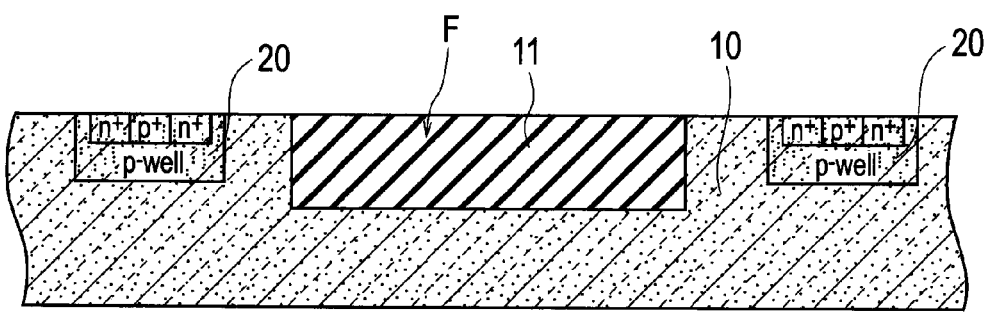
FIG. 18 is a process cross-sectional view for explaining the manufacturing method of the semiconductor device according to the third embodiment of the present invention (No. 2).
Figure 19:
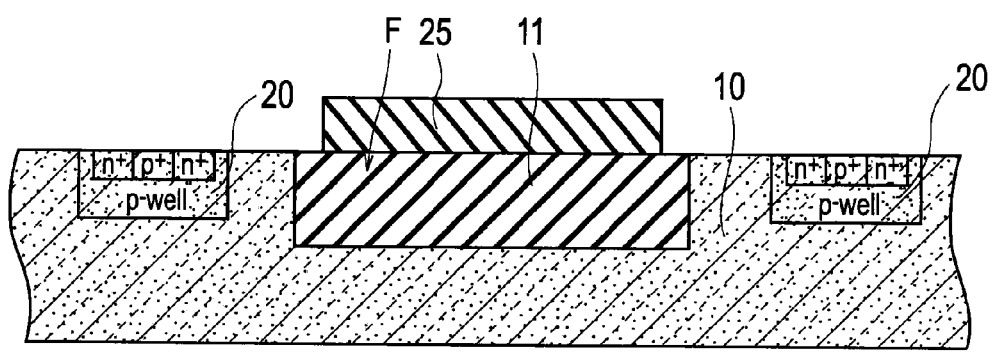
FIG. 19 is a process cross-sectional view for explaining the manufacturing method of the semiconductor device according to the third embodiment of the present invention (No. 3).

In the first and second embodiments of the present invention, the case where the semiconductor device 1 is the SBD has been illustrated; however, the present invention can also be applied to the case where the semiconductor device 1 is a transistor. In the following, an example is considered, where DMOSFETs are formed in a matrix form with m rows and n columns on the wafer 100. FIG. 17 to FIG. 19 partially show process cross-sectional views of the DMOSFETs arranged at positions (i−1, j) to (i+1, j).

As shown in FIG. 17, on the principal surface of the semiconductor substrate 10, on which p-well regions (p-wells) 20, each including $n^+$ contact regions ($n^+$) and a $p^+$ contact region ($p^+$), are formed, the testing conductor films $M_{11}$ to $M_{mn}$ are arranged so as to be spaced apart from one another in the matrix form with m rows and n columns, and a Schottky cell is formed for each of the DMOSFETs.

Then, in a similar way to the method described in the first embodiment, electric characteristics of the respective Schottky cells are measured by using the testing conductor films $M_{11}$ to $M_{mn}$. For example, measurement of current-voltage characteristics between the testing conductor films $M_{11}$ to $M_{mn}$ and the respective p-well regions 20, and the like are performed by the prober and the like. The electric characteristics of the respective Schottky cells are recorded together with the positional information of the testing conductor films $M_{11}$ to $M_{mn}$.

Quality determination for the respective Schottky cells is performed by using measurement results of the electric characteristics of the respective Schottky cells. Then, a region in which the Schottky cell determined to be the defective cell is formed is specified to be a defect region 11 containing a crystal defect F. Here, as shown by an arrow in FIG. 17, it is assumed that the crystal defect F is determined to be present in an $n^+$ contact region of a p-well region 20 on which a testing conductor film $M_{ij}$ is arranged.

After all of the testing conductor films $M_{11}$ to $M_{mn}$ are removed, the defect region 11 is turned into an insulating region as shown in FIG. 18. Specifically, among the surface of the semiconductor substrate 10, into the region in which a DMOSFET including the $n^+$ contact region determined to contain the crystal defect F is formed, the impurity ions (dopant) of boron (B) and the like are selectively doped. A crystal structure of the region of the semiconductor substrate 10 is broken, into which the ions are implanted, and the defect region 11 is formed.

Thereafter, as shown in FIG. 19, an insulating film 25 is formed on the defect region 11. For example, a silicon oxide ($SiO_2$) film that becomes the insulating film 25 is deposited on the entire principal surface of the semiconductor substrate 10. Then, the $SiO_2$ film is selectively removed by etching by using a photoresist film as a mask, which is patterned by using the photolithography technique and the like, whereby a structure shown in FIG. 19 is formed.

Thereafter, by a semiconductor manufacturing technique and the like, which are known in public, drain regions, source regions, gate electrodes and the like are formed, whereby the DMOSFETs are completed.

In the DMOSFETs manufactured as described above, the p-well regions 20 are left only in regions of the semiconductor substrate 10, in which the crystal defect F is not present. Accordingly, the crystal defect F does not affect the electric characteristics of the DMOSFETs. In other words, DMOSFETs in which such a yield decrease resulting from the crystal defect of the semiconductor substrate 10 is suppressed are provided. Others are substantially similar to those of the first embodiment, and a duplicate description will be omitted.

MODIFICATION EXAMPLE

In the above description, the example has been illustrated, where the position of the defect region 11 containing the crystal defect F is specified after the $n^+$ contact regions, the $p^+$ contact regions and the p-well regions 20 are formed. However, the defect region 11 may be specified after the gate electrodes, interlayer insulating films and first conductor films are formed.

Figure 20:
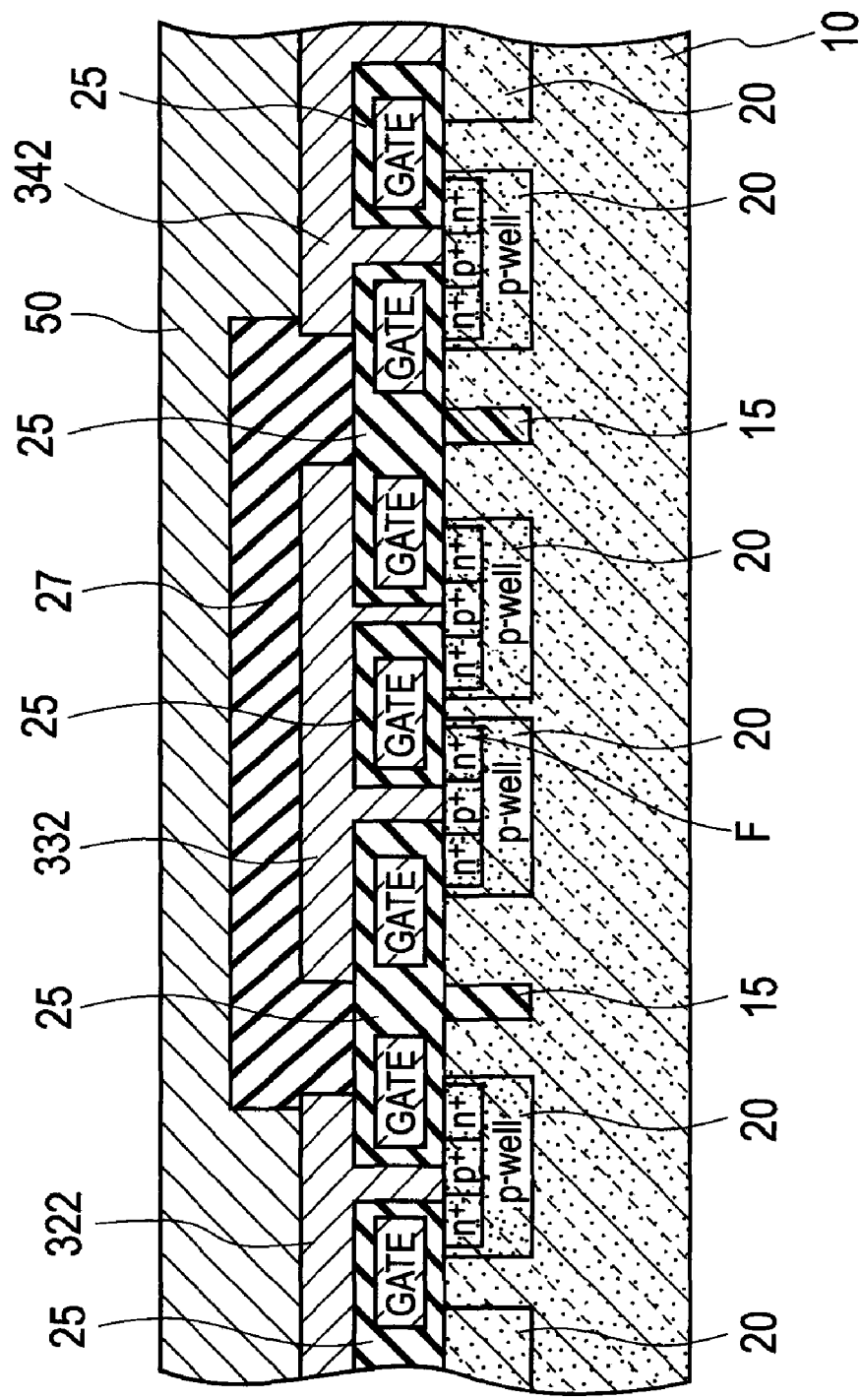
FIG. 20 is a schematic view showing a configuration of a semiconductor device according to a modification example of the third embodiment of the present invention.

FIG. 20 shows an example of DMOSFETs manufactured such that the position of the defect region 11 is specified after the first conductor films 322, 332 and 342 are formed. In the DMOSFET shown in FIG. 20, the p-well regions 20 and the guard ring 15 are formed in the vicinity of the principal surface in the semiconductor substrate 10. The guard ring 15 is formed so as to surround peripheries of respective DMOSFETs. Then, on the principal surface of the semiconductor substrate 10, the insulating film 25 is arranged as the interlayer insulating film so as to surround the gate electrodes (displayed as "GATE" in FIG. 20).

The first conductor film is formed for each of the DMOSFETs formed in the matrix form with m rows and n columns;

however, only the first conductor films 322, 332 and 342 are displayed in FIG. 20. The first conductor films 322, 332 and 342 electrically connect to the principal surface of the semiconductor substrate 10, which is exposed to regions in which the insulating film 25 is not arranged. In other words, the p-well regions 20 of the respective DMOSFETs and the first conductor films 322, 332 and 342 form the Schottky junctions.

Electric characteristics of the p-well regions 20 are measured by using the first conductor films 322, 332 and 342. For example, voltages are applied between the respective first conductor films 322, 332 and 342 and the semiconductor substrate 10 by the prober and the like, and measurement of forward current-voltage characteristics and reverse current-voltage characteristics of the respective p-well regions 20, and the like are performed. In other words, in a similar way to the case of the second embodiment, the first conductor films 322, 332 and 342 also serve as the testing conductor films.

Quality determination is performed for each of the DMOSFETs by using measurement results of the electric characteristics of the respective p-well regions 20. Here, it is assumed that the crystal defect F is present in the p-well region 20 of the DMOSFET on which the first conductor film 332 is arranged. In other words, a position coordinate on the semiconductor substrate 10, on which the DMOSFET including the first conductor film 332 is formed, is recorded as defect position information.

As shown in FIG. 20, an insulating film 27 is arranged only on the first conductor film 332 arranged on the defect region 11. Therefore, the first conductor film 332 becomes an isolated-pattern conductor film.

Thereafter, a second conductor layer 50 is formed so as to be brought into contact with the first conductor films other than the first conductor films 332, whereby the semiconductor devices shown in FIG. 20 are completed. For the second conductor layer 50, Al, Cu and the like are adoptable.

Figure 21:
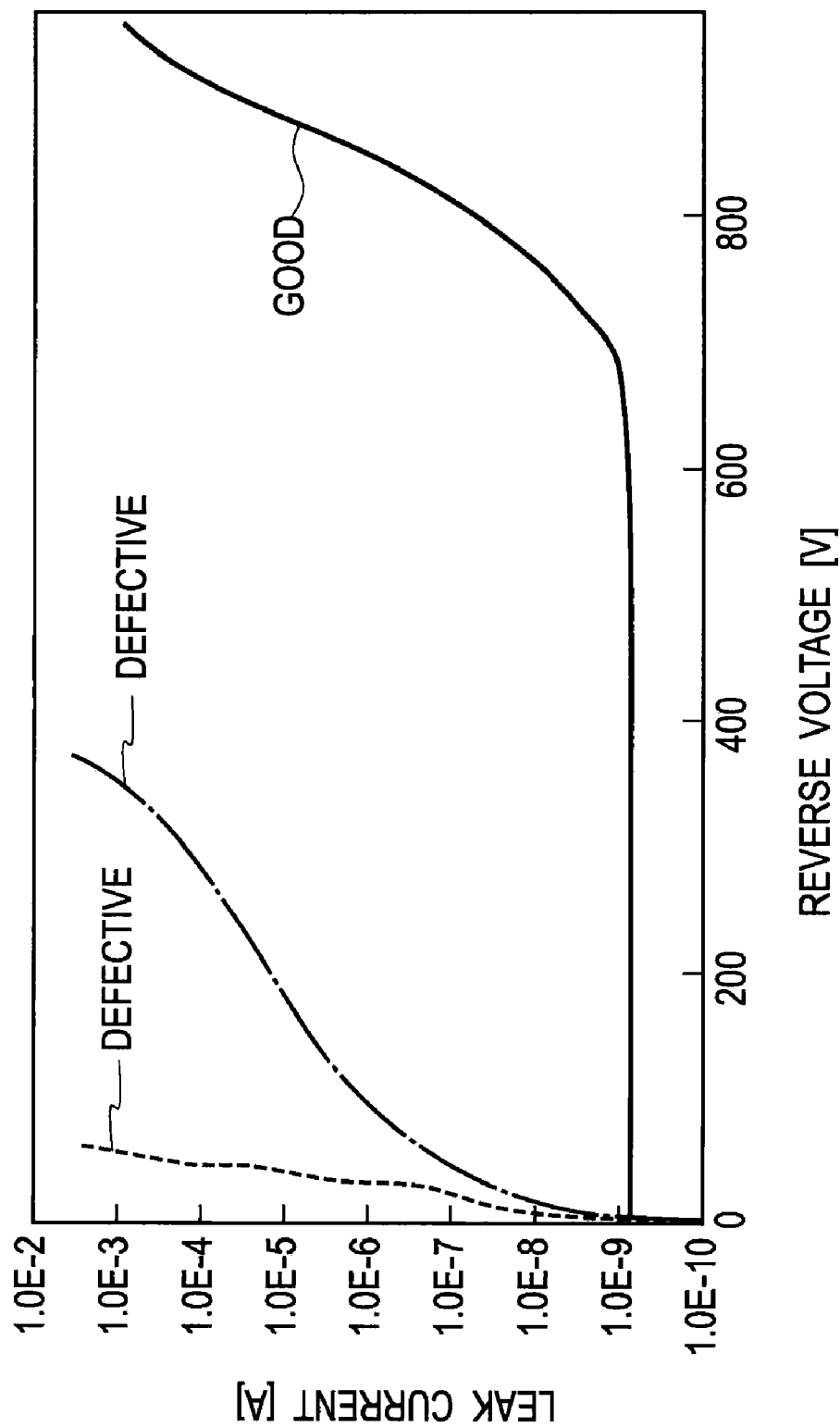
FIG. 21 is a graph for explaining a quality determination method of the semiconductor device according to the modification example of the third embodiment of the present invention.

In the DMOSFETs shown in FIG. 20, the electric characteristics of the transistors, each including an active region surrounded by the guard ring 15, are measured, and the crystal defect F is detected. The guard ring 15 is formed for the respective transistors, and accordingly, the reverse voltages can be applied to the transistors. Therefore, the quality determination for the respective transistors can be executed by using, as a reference, a reverse voltage value that is a product specification of the DMOSFETs. FIG. 21 shows an example of performing the quality determination for the DMOSFETs based on leak current values in the case of applying the reverse voltages thereto. For example, a specification value is set at a magnitude of the leak current when the reverse voltage is 100V, and a DMOSFET in which the leak current is larger than the specification value concerned is determined to be defective.

As described above, in accordance with the manufacturing method of the DMOSFETs shown in FIG. 20, the quality determination for the respective transistors can also be performed by using the measurement results of both of the forward current-voltage measurement and the reverse current-voltage measurement. Therefore, the crystal defect F that causes the defect can be detected with high accuracy. Moreover, the first conductor film of the transistor containing the defect region 11 is turned into the isolated-pattern conductor film, and accordingly, DMOSFETs having good electric characteristics can be formed even in the case where the semiconductor substrate 10 contains the defect region 11.

(Other Embodiments)

As mentioned above, the present invention has been described based on the first to third embodiments; however, it should not be understood that the description and the drawings, which form a part of the disclosure, limit this invention. From this disclosure, a variety of alternative embodiments, examples and operation technologies will be obvious for those skilled in the art.

In the descriptions of the first to third embodiments already mentioned, the case has been illustrated, where the Schottky junction in which the semiconductor substrate and the conductor film that is the metal film or the polysilicon film are brought into contact with each other is formed; however, the semiconductor substrate in which the defect region is eliminated from the active region can be realized in a similar way even in the case where a conductor film other than the metal film or the polysilicon film is arranged on the semiconductor substrate.

As described above, it is a matter of course that the present invention incorporates a variety of embodiments and the like, which are not described herein. Hence, the technical scope of the present invention should be determined only by the invention specifying items according to the scope of claims reasonable from the above description.

INDUSTRIAL APPLICABILITY

The semiconductor device of the present invention and the manufacturing method thereof are usable for the semiconductor industry and the electronic instrument industry, which include a manufacturing industry that manufactures the semiconductor device including the semiconductor layer arranged on the semiconductor substrate.

What is claimed is:

1. A semiconductor device comprising:
   a semiconductor substrate having a defect region containing a crystal defect, the semiconductor substrate being made of either of silicon carbide (SiC) and gallium nitride (GaN);
   a first insulating film arranged on the semiconductor substrate, and coating the defect region;
   a second insulating film arranged on an outer peripheral portion of the semiconductor substrate, and surrounding the first insulating film; and
   a conductor film electrically connecting to a principal surface of the semiconductor substrate, the principal surface being exposed to a region that is not coated with the first insulating film and the second insulting film.

2. The semiconductor device of claim 1, wherein the crystal defect is a micropipe.

3. The semiconductor device of claim 1, wherein an isolated-pattern conductor film electrically insulated from the conductor film is inserted between the defect region and the first conductor film.

4. The semiconductor device of claim 1, wherein the defect region is an insulating region.

5. The semiconductor device of claim 1, wherein a periphery of the defect region is surrounded by a guard ring.

6. The semiconductor device of claim 3, wherein a periphery of the isolated-pattern conductor film is covered with a third insulating film.

7. A manufacturing method of a semiconductor device, comprising:
   arranging a plurality of testing conductor films on a principal surface of a semiconductor substrate made of either of silicon carbide (SiC) and gallium nitride (GaN);
   measuring electric characteristics of the semiconductor substrate by using the respective testing conductor films;

specifying a defect region in the semiconductor substrate, the defect region containing a crystal defect, by using measurement results of the electric characteristics; and forming a first insulating film that coats the defect region on the semiconductor substrate and a second insulating film that surrounds the first insulating film, the second insulating film arranging on an outer peripheral portion of the semiconductor substrate; and forming a conductor film that electrically connects to a region in the semiconductor substrate, the region excluding the defect region, on the principal surface of the semiconductor substrate.

8. The manufacturing method of a semiconductor device of claim 7, wherein the crystal defect is a micropipe.

9. The manufacturing method of a semiconductor device of claim 7, further comprising: forming a third insulating film between the testing conductor film on the defect region and the conductor film.

10. The manufacturing method of a semiconductor device of claim 7, further comprising: turning the defect region into an insulating region.

11. The manufacturing method of a semiconductor device of claim 7, wherein the measurement of the electric characteristics of the semiconductor substrate is performed plural times while changing positions where the plurality of testing conductor films are arranged.

* * * * *